United States Patent [19]
Kappeler et al.

[11] Patent Number: 4,875,217
[45] Date of Patent: Oct. 17, 1989

[54] LASER DIODE ARRAY WITH LATERAL COUPLING

[75] Inventors: Franz Kappeler, Puchheim; Thomas Wolf, Munich; Bernhard Stegmueller, Augsburg, all of Fed. Rep. of Germany

[73] Assignee: Siemens Aktiengesellschaft, Berlin and Munich, Fed. Rep. of Germany

[21] Appl. No.: 196,387

[22] Filed: May 20, 1988

[30] Foreign Application Priority Data

May 22, 1987 [DE] Fed. Rep. of Germany ....... 3717383

[51] Int. Cl.$^4$ ................................................. H01S 3/19
[52] U.S. Cl. ........................................ 372/50; 372/46
[58] Field of Search .............................. 372/45, 46, 50

[56] References Cited
U.S. PATENT DOCUMENTS

| 4,692,925 | 9/1987 | Botez ................................. | 372/46 |
| 4,719,630 | 1/1988 | Streifer .............................. | 372/50 |
| 4,722,089 | 1/1988 | Botez et al. ....................... | 372/50 |

FOREIGN PATENT DOCUMENTS

| 0091859 | 10/1983 | European Pat. Off. . |
| 0187716 | 7/1986 | European Pat. Off. . |
| 0206642 | 12/1986 | European Pat. Off. . |
| 0238212 | 9/1987 | European Pat. Off. . |
| 3611167 | 10/1987 | Fed. Rep. of Germany . |
| 2179789 | 3/1987 | United Kingdom . |
| 2180096 | 3/1987 | United Kingdom . |
| 2187330 | 9/1987 | United Kingdom . |

Primary Examiner—James W. Davie

[57] ABSTRACT

A laser diode array includes ridges formed in a cover layer forming an upper layer of a semiconductor body, the ridges being provided with separate contacts to produce laser active stripes in an active layer situated between a substrate and the cover layer. The thickness of the cover layer between the ridges is such that lateral coupling is achieved, while the thickness of the cover layer in the region adjoining the outside edges of the outer ridges is small enough so that lateral emission losses are low as the result of quasi-index guidance based on the metal clad ridge waveguide principle. A second embodiment provides wave guidance at the outside edges of the outer ridges by a buried heterostructure principle.

11 Claims, 1 Drawing Sheet

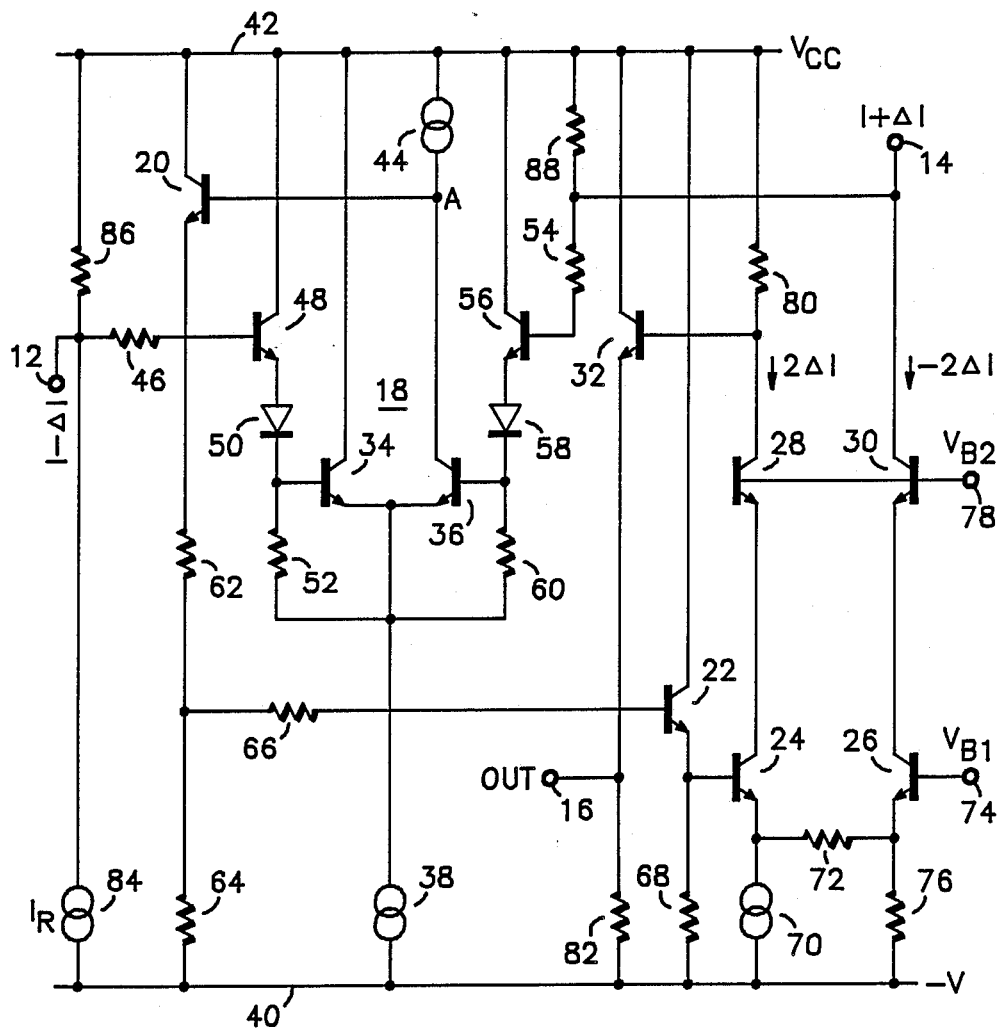

LASER DIODE ARRAY WITH LATERAL COUPLING

BACKGROUND OF THE INVENTION

1. Field of the Invention

The present invention relates generally to a laser diode array and, more particularly, to an array including a substrate, a laser active layer, and a cover layer forming at least two ridges over the active layer.

2. Description of the Related Art

The operating principle of a laser is based essentially upon the generation of radiation in an active region which is intensified only for certain frequencies due to resonance. Laser-active regions, which are commonly formed as strip-like regions, have end surfaces which act as partly reflecting mirrors. Resonance occurs when the longitudinal extent of the active region corresponds to a whole plurality of half wavelengths of laser energy. A single frequency laser diode, for example, can be manufactured by replacing a single laser-active region by a plurality of laser active regions that are coupled, or optically joined, to one another.

In index-guided lasers, the localization of the radiant energy field within the laser-active stripes is effected by a change in the refractive index of the surrounding material. In these index-guided lasers, the intensity of the radiation field decays very quickly outside of the active layer. With a suitable layer structure in this type of semiconductor laser, lateral emission losses can be kept very low such as for high efficiency. However, lateral optical coupling of various laser-active strips of this type is difficult.

In German Patent Application No. P37 06 477.0 is disclosed a semiconductor laser arrangement comprising an index-guidance means or quasi-index-guidance means wherein lateral coupling is accomplished by elimination of the index guidance means in sections. Such complete but only sectional cancellation of the electromagnetic isolation, or guidance, of the laser active stripes from one another has a disadvantage in that the structure of the various laser resonators is not sufficiently uniform.

In German Patent Application No. P37 08 666.9 is disclosed a laser arrangement having separately drivable, coupled semiconductor lasers. Index guidance for the radiation field is also disclosed. The coupling, or optical joining, is present in a vertical direction so that the index guidance of the surrounding semiconductor material provides a relatively high degree of localization of the radiation within the laser active strips. With the arrangement disclosed therein, the vertical layer structure is considerably more involved than for laterally coupled semiconductor arrays.

SUMMARY OF THE INVENTION

An object of the present invention is to provide a laser diode array having lateral optical coupling of the laser diodes to one another, the array being capable of being manufactured in relatively few process steps and having emission losses at the outside of the array which are as low as possible. This and other objects are achieved in a laser array component including a plurality of stripe geometry lasers having interrupted contacts between respective laser ridges to enable the corresponding laser stripes to be separately driven. Furthermore, a cover layer on the array is of a thickness between neighboring ridges so that lateral coupling of the laser stripes occurs and is of a thickness outside the region of the laser ridges and their interspaces so that a waveguidance effect is realized at the sides of the array. The terms strip and stripe are applied interchangeably herein.

The solution presented by the present invention is comprised of providing a prescribed wave guidance effect between adjacent laser active strips of an index guided or quasi-index-guided laser diode array which is weak in comparison to the wave guidance effect of known individual semiconductor lasers. Otherwise, the geometry of the laser structure essentially corresponds to that of a metal clad ridge waveguide (MCRW) laser, in one embodiment. First, a substrate of doped III-V semiconductor material of a first conductive type, which is usually n-doped, is provided. Thereafter, a layer, which is usually an undoped layer and is intended as an active layer for the laser stripes, is applied over the substrate. After this, a doped semiconductor material of a second conductive type, which is usually p-doped, is provided as a cover layer. Ridges which extend substantially parallel to one another are formed in the cover layer so that radiation is localized under the ridges in accordance with the MCRW principle. The ridges, thus, define the direction and extent of the laser stripes in the array. Ridges, as the term is used herein, refers to any means for defining or guiding a laser radiation field, and is not limited strictly to raised structures.

For a component structure in accordance with the invention, the thickness of the cover layer as it extends between the active layer and the surface of the component in the regions between the adjacent parallel ridges is of a thickness so that a prescribed lateral coupling occurs between two neighboring ridges.

Of particular significance in the present invention is that, even though there exists lateral coupling of the laser stripes to one another, precautions are undertaken to keep the emission losses low toward the outside of the array, i.e. from the respective outer ridges toward the edge of the component. The external emission losses are kept low by an extremely great quasi-index-guidance being provided toward the outside. To this end, the thickness of the cover layer as measured between the active layer and the surface of a component or of the cover layer is kept low so that, together with an oxide layer applied over the semiconductor material of the cover layer, the intended wave guidance effect is achieved in the region outside the ridges and their interspaces. The maximum thickness of the cover layer in this outside region is preferably 0.3 micrometers.

Alternately, a component structure in accordance with the invention is be provided which localizes the radiant energy field in the region occupied by the ridges by limiting the extent of the active layer at the sides of the component in accordance with the buried heterostructure (BH) principle. This also provides a lateral index guidance effect toward the outside of the array. With this alternate embodiment, the semiconductor material of the cover layer may have a full layer thickness in the regions lying outside the ridges and their interspaces yet still provide protection against losses.

An oxide layer can also be applied to the cover layer in the region between the ridges. The thickness of the semiconductor material of the cover layer as measured between the active layer and the cover layer surface or the oxide layer preferably lies in a range of from approximately 0.4 micrometers through 0.8 micrometers, inclusive, in the interspaces between the ridges. When an oxide layer, which is an electric insulator, is applied, the effective discontinuity in the refractive index is lower than when a metal layer is applied directly on the cover layer. The lateral optical coupling between neighboring laser stripes for an embodiment utilizing the oxide layer is therefore greater, so that the thickness of the semiconductor material of the cover layer can be less in the region between the ridges yet still provide the same degree of coupling as is provided in an embodiment without the oxide layer. The ridges preferably each have separate electrical contacts, and a cooperating electrical contact, or common contact, is applied at the free side of the substrate, as well.

DESCRIPTION OF THE PREFERRED EMBODIMENTS

Figure 1:
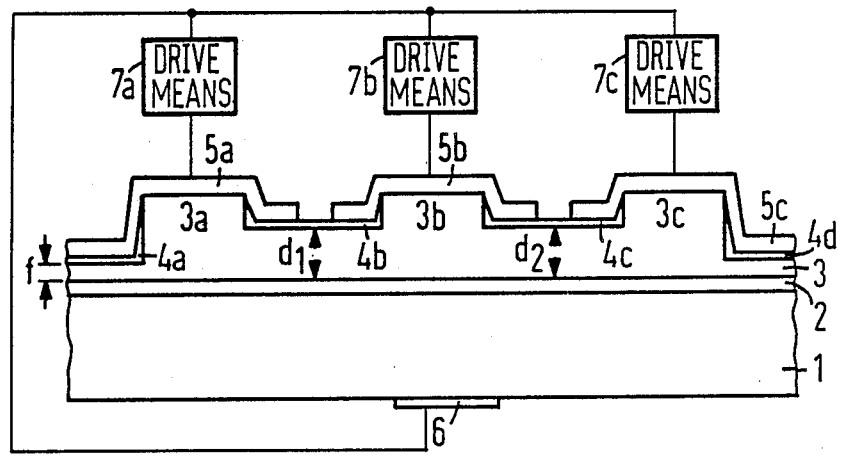
FIG. 1 is a cross section proceeding transversely relative to a longitudinal direction of ridges of a laser diode array according to the principles of the invention providing a wave guidance effect based on the MCRW principle.

In FIG. 1 is shown a structure wherein a wave guidance effect at the outside of the component is based upon the metal clad ridge waveguide (MCRW) principle and is caused by a quasi-index discontinuity. A substrate 1 of InP is provided, over which is grown an active layer 2 of InGaAsP having a thickness of approximately 0.15 micrometers. A cover layer 3 of InP is grown over the active layer 2. Ridges 3a, 3b and 3c are formed in the cover layer 3, for example, by etching and the like. Respective oxide layers 4a, 4b, 4c and 4d are applied generally between adjacent upper edges of respective ones of two successive ridges 3a, 3b and 3c and between respective outer edges of the outermost ridges 3a and 3c and the edges of the component. Oxide layers, as used herein, includes other insulating materials as well. The adjoining oxide layers 4a, 4b, 4c and 4d, along with partially covering contacts 5a, 5b, and 5c, are applied to the ridges 3a, 3b, and 3c. The contacts 5a, 5b and 5c are separated from one another and, thus, are separately electrically connectable so that individual laser stripes proceeding beneath the ridges 3s, 3b and 3c can be individually driven, such as by drive means 7a, 7b and 7c, respectively.

Thicknesses $d_1$ and $d_2$ of the cover layer 3a in regions between the ridges 3a, 3b and 3c in the exemplary embodiment both amount to approximately 0.6 micrometers. In regions outside of the respective outer ridges 3a and 3c and extending toward the edge of the component, the cover layer 3 has a thickness f of approximately 0.2 micrometers. The ridges 3a, 3b and 3c have a width of approximately 2 micrometers and a center to center spacing of approximately 5 micrometers. This spacing corresponds approximately to the dimensions known in the prior art. The laser diode array, thus, formed is designed for an emission in the wavelength of 1.3 micrometers. A cooperating contact 6 is applied to a free side of the substrate 1 to provide a second contact for each of the laser stripes. Although three ridges and three laser stripes are shown, the principles of the instant inventions are applicable to arrays of any number of laser stripes and to those of other configurations.

Figure 2:
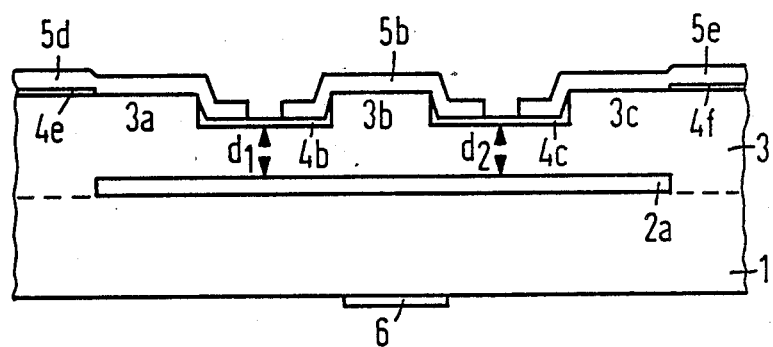
FIG. 2 is a cross section proceeding transversely relative to a longitudinal direction of ridges of a laser diode array according to the invention providing wave guidance effect based on the BH principle.

A second embodiment of the invention is disclosed in FIG. 2, in which similar parts are given the same reference character as in FIG. 1. In comparison to the structure disclosed in FIG. 1, the structure of FIG. 2 differs in that an active layer 2a is limited toward the outside of the component so that a localization of the radiant energy field in the region lying under the ridges 3a, 3b and 3c and their interspaces occurs due to lateral index discontinuity at the edge of the active layer 2a. Thus, the second embodiment is based upon the principle of a buried heterostructure (BH) with index guidance. The boundary between the substrate 1 and the cover layer 3' (as indicated in FIG. 2 by a dashed line) proceeds as a planar extension of the active layer 2a toward the edges of the component. The boundary is between the two different conductivity types of doped semiconductor material.

Respective oxide layers 4b, 4c, 4e and 4f are applied between the upper edges of respective neighboring ridges 3a, 3b and 3c and between the respective outer upper edges of the outer ridges 3a and 3c extending to the edge of the component. The adjoining oxide layers 4b, 4c, 4e and 4f have partially covering contacts 5b, 5d, and 5e which are applied to the respective ridges 3a, 3b, and 3c. The contacts 5b, 5d and 5e are separated from one another and, thus, are separately electrically connectable, such as to driving means as shown in FIG. 1. The cooperating contact 6 is applied to the free side of the substrate 1.

In both embodiments, the substrate is preferably of a doped semiconductor material of a first conductivity type and the cover layer of a doped semiconductor material of a second conductivity type. Preferably, the thickness of the semiconductor material, which constitutes the cover layer 3 in the illustrated embodiment, is the same between each pair of neighboring ridges.

Thus, there is provided a laser diode array in which lateral coupling or optical joining between the ridges is possible due to the thickness of the covering layer lying therebetween. Furthermore, the outside edges of the outside ridges have an index guidance means which, in the illustrated embodiments, is based either on the metal clad ridge waveguide (MCRW) principle or on the buried heterostructure principle so that lateral emission losses of the array are kept quite low.

Although other modifications and changes may be suggested by those skilled in the art, it is the intention of the inventors to embody within the patent warranted hereon all changes and modifications as reasonably and properly come within the scope of their contribution to the art.

We claim:

1. A laser diode array in a component for lateral coupling of laser emissions, comprising:

a substrate of doped semiconductor material of a first conductive type;

an active layer on said substrate and means for providing a resonant cavity in said active layer and operable to generate a laser emission;

a cover layer of doped semiconductor material of a second conductive type over said active layer, at least two ridges formed in said cover layer, said at least two ridges being allocated to corresponding laser stripes of said array, said cover layer being of a thickness in a region between two adjacent ones of said ridges so that a lateral coupling of said laser stripes occurs;

oxide layers on said cover layer in regions between outer upper edges of outer ones of said at least two ridges and edges of said component;

a contact on each of at least two ridges, said contacts being separate from one another between said ridges to enable said laser stripes to be separately driven;

a cooperating contact on a free surface of said substrate; and said component having a layer structure outside a region occupied by said at least two ridges and their interspaces so that a wave guidance effect occurs at sides of said array.

2. A laser diode array as claimed in claim 1, further comprising:

further oxide layers on said cover layer between upper edges of neighboring ones of said ridges.

3. A laser diode array as claimed in claim 1, wherein said cover layer in a region between neighboring ones of said ridges has a thickness for coupling lying in a range of 0.4 micrometers through 0.8 micrometers, inclusive.

4. A laser diode array as claimed in claim 1, wherein said active layer is surface-wide on said substrate said cover layer being on said active layer and said ridges being formed in said cover layer, said cover layer having a thickness in a region that adjoins outer ones of said ridges toward an edge of said component that is less than a thickness of a region between said ridges so that a wave guidance effect is present at sides of said array.

5. A laser diode array as claimed in claim 1, wherein said active layer is provided in a region of said ridges and their interspaces and is limited toward an edge of said component so that wave guidance is effected at edges of said array.

6. A laser diode array as claimed in claim 4, wherein said cover layer has a thickness of no more than 0.3 micrometers in said region that adjoins outer ones of said ridges toward an edge of said component.

7. A laser diode array as claimed in claim 1, wherein semiconductor material between each of said ridges have the same thickness as measured between said active layer and a surface of said component.

8. A laser diode array, comprising:

a planar substrate of a first semiconductor material;

an active layer applied on a first surface of said substrate, said active layer generating a radiant energy field;

means forming a resonant cavity in said active layer to stimulate a laser emission;

a cover layer applied over said active layer, said cover layer being of a second semiconductor material, said cover layer having regions of different thicknesses, first regions of said cover layer defining a plurality of substantially parallel ridges, second regions of said cover layer defining interspaces between neighboring ones of said parallel ridges, and third regions defining outside regions extending from outside edges of outermost ones of said ridges toward edges of said array, said second regions being of a thickness to permit lateral optical coupling between laser stripes defined by said ridges;

wave guidance means for localizing said radiant energy field in said first and second regions and inhibiting said radiant energy field in said third region;

separate electrical contacts applied to each of said ridges; and a common contact applied to said substrate opposite said active layer.

9. A laser diode array as claimed in claim 8, wherein said wave guidance means includes limiting said active layer in said third regions.

10. A laser diode array as claimed in claim 8, wherein said wave guidance means includes said cover layer in said third regions being of a thickness substantially less than a thickness of said cover layer in said second regions.

11. A laser diode array as claimed in claim 8, further comprising:

oxide layers applied on said cover layer in said second and third regions.

* * * * *